(12) United States Patent
Lassila et al.

(10) Patent No.: US 6,235,820 B1
(45) Date of Patent: May 22, 2001

(54) ALKYLATED AMINOALKYLPIPERAZINE SURFACTANTS

(75) Inventors: Kevin Rodney Lassila, Macungie; Kristen Elaine Minnich; Richard Van Court Carr, both of Allentown, all of PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 09/416,429

(22) Filed: Oct. 12, 1999

(51) Int. Cl.$^7$ ..................................................... C08K 5/34
(52) U.S. Cl. .............................................................. 524/100
(58) Field of Search ............................................. 524/100

(56) References Cited

U.S. PATENT DOCUMENTS

| | | | |
|---|---|---|---|
| 3,007,929 | 11/1961 | Nikawitz et al. | 260/268 |
| 4,946,612 | * 8/1990 | Kanamori | 252/49.5 |
| 5,098,478 | 3/1992 | Krishnan et al. | 106/23 |
| 5,562,762 | 10/1996 | Mrvos et al. | 106/22 H |
| 6,127,101 | * 10/2000 | Lassila | 430/331 |

FOREIGN PATENT DOCUMENTS

| | | |
|---|---|---|
| 6438080 | 2/1989 | (JP) . |

OTHER PUBLICATIONS

Schwartz, J. "The Importance of Low Dynamic Surface Tension in Waterborne Coatings", Journal of Coatings Technology, Sep. 1992.

Wirth, W., Storp, S.; Jacobsen, W. "Mechanisms Controlling Leaf Retention of Agricultural Spray Solutions", Pestic. Sci. 1991, 33, 411–420.

Medins, S. W.; Sutovich, M. N., "Using Surfactants to Formulate VOC Compliant Waterbased Inks", Am. Ink Maker 1994, 72 (2), 32–38.

Zagudullin and Baimetov [J. Gen. Chem. USSR (Engl. Transl.) 1991, 61, 889–894; Zh. Obshch. Khim. 1991, 61, 978–985].

* cited by examiner

*Primary Examiner*—Paul R. Michl
(74) *Attorney, Agent, or Firm*—Michael Leach

(57) ABSTRACT

This invention provides water-based compositions, particularly coating, ink, fountain solution, adhesive, agricultural and electronics cleaning compositions, manifesting reduced equilibrium and dynamic surface tension by the incorporation of a surface tension reducing amount of certain alkylated aminoalkylpiperazine compounds of the structure

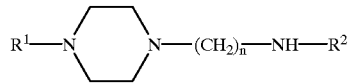

where one of $R^1$ and $R^2$ is a C5–C14 alkyl or cycloalkyl group and the other is H, or both of $R^1$ and $R^2$ are C5 to C8 alkyl groups, and n is 2 or 3.

24 Claims, No Drawings

ALKYLATED AMINOALKYLPIPERAZINE SURFACTANTS

FIELD OF THE INVENTION

The invention relates to the use of alkylated aminoalkylpiperazines to reduce the surface tension in water-based systems.

BACKGROUND OF THE INVENTION

The ability to reduce the surface tension of water is of great importance in waterborne coatings, inks, adhesives, and agricultural formulations because decreased surface tension translates to enhanced substrate wetting in actual formulations. Surface tension reduction in water-based systems is generally achieved through the addition of surfactants. Performance attributes resulting from the addition of surfactants include enhanced surface coverage, fewer defects, and more uniform distribution. Equilibrium surface tension performance is important when the system is at rest. However, the ability to reduce surface tension under dynamic conditions is of great importance in applications where high surface creation rates are utilized. Such applications include spraying, rolling and brushing of coatings or spraying of agricultural formulations, or high speed gravure or ink-jet printing. Dynamic surface tension is a fundamental quantity which provides a measure of the ability of a surfactant to reduce surface tension and provide wetting under such high speed application conditions.

Traditional nonionic surfactants such as alkylphenol or alcohol ethoxylates, and ethylene oxide (EO)/propylene oxide (PO) copolymers have excellent equilibrium surface tension performance but are generally characterized as having poor dynamic surface tension reduction. In contrast, certain anionic surfactants such as sodium dialkyl sulfosuccinates can provide good dynamic results, but these are very foamy and impart water sensitivity to the finished coating.

There is a need for a family of surfactants which provide good equilibrium and dynamic surface tension properties, are low-foaming, are liquids at room temperature to facilitate handling, are stable under basic conditions and would be widely accepted in the waterborne coating, ink, adhesive, and agricultural formulation industries.

The importance of reducing equilibrium and dynamic surface tension in applications such as coatings, inks, and agricultural formulations is well-appreciated in the art.

Low dynamic surface tension is of great importance in the application of waterborne coatings. In an article, Schwartz, J. "The Importance of Low Dynamic Surface Tension in Waterborne Coatings", Journal of Coatings Technology, September 1992, there is a discussion of surface tension properties in waterborne coatings and a discussion of dynamic surface tension in such coatings. Equilibrium and dynamic surface tension were evaluated for several surface active agents. It is pointed out that low dynamic surface tension is an important factor in achieving superior film formation in waterborne coatings. Dynamic coating application methods require surfactants with low dynamic surface tensions in order to prevent defects such as retraction, craters, and foam.

Efficient application of agricultural products is also highly dependent on the dynamic surface tension properties of the formulation. In an article, Wirth, W.; Storp, S.; Jacobsen, W. "Mechanisms Controlling Leaf Retention of Agricultural Spray Solutions", Pestic. Sci. 1991, 33, 411–420, the relationship between the dynamic surface tension of agricultural formulations and the ability of these formulations to be retained on a leaf was studied. These workers observed a good correlation between retention values and dynamic surface tension, with more effective retention of formulations exhibiting low dynamic surface tension.

Low dynamic surface tension is also important in high-speed printing as discussed in the article "Using Surfactants to Formulate VOC Compliant Waterbased Inks", Medina, S. W.; Sutovich, M. N. Am. Ink Maker 1994, 72 (2), 32–38. In this article, it is stated that equilibrium surface tensions (ESTs) are pertinent only to ink systems at rest. EST values, however, are not good indicators of performance in the dynamic, high speed printing environment under which the ink is used. Dynamic surface tension is a more appropriate property. This dynamic measurement is an indicator of the ability of the surfactant to migrate to a newly created ink/substrate interface to provide wetting during high speed printing.

U.S. Pat. No. 5,098,478 discloses water-based ink compositions comprising water, a pigment, a nonionic surfactant and a solubilizing agent for the nonionic surfactant. Dynamic surface tension in ink compositions for publication gravure printing must be reduced to a level of about 25 to 40 dynes/cm to assure that printability problems will not be encountered.

U.S. Pat. No. 5,562,762 discloses an aqueous jet ink of water, dissolved dyes and a tertiary amine having two polyethoxylate substituents and that low dynamic surface tension is important in ink jet printing.

Although many monoalkylated aminoalkylpiperazine derivatives have been reported, it has not been recognized these materials possess surface active properties.

U.S. Pat. No. 3,007,929 discloses compounds of the form

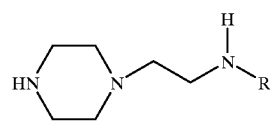

where R is a C8 to C16 linear alkyl group. Aqueous solutions of the C12 and C14 derivatives were effective sterilizing and disinfecting agents for food containers and kitchen utensils.

Zagudullin and Baimetov [J. Gen. Chem. USSR (Engl. Transl.) 1991, 61, 889–894; Zh. Obshch. Khim. 1991, 61, 978–985] report the alkylation of aminoethylpiperazine with ethyl chloride, allyl and methallyl chlorides, and chloropropenes. Depending on reaction conditions and the amount of alkylating agent used, mono-, di-, or tri-allyl and -methallyl derivatives can be formed:

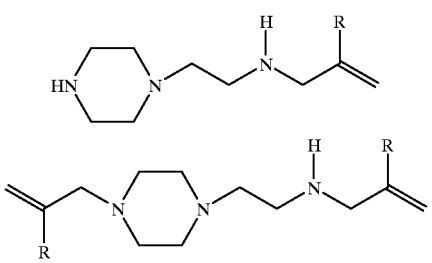

-continued

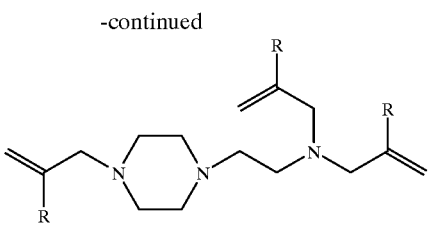

where R=H or CH$_3$. The workers also report the formation of compounds of the form

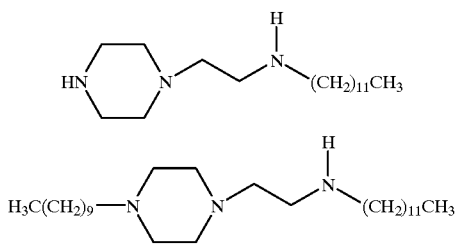

Alkylated aminoethylpiperazine compounds are said in this article to be important as catalysts in the synthesis of polyurethanes, polyamines, and epoxy resins. They are also said to be useful as selective solvents and as auxiliary agents in the textile industry.

JP 01 38,080 discloses a class of compounds of the structure

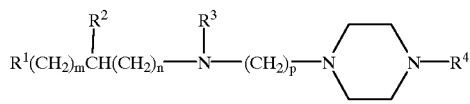

where $R^1$ can be C3–C8 linear or branched aliphatic, $R^2$ and $R^3$ can be C3–C11 linear or branched aliphatic, one of $R^2$ or $R^3$ must be H or C1–C2, $R^4$ is H or C1–C12 linear or branched alkyl, m and n are each an integer from 0 to 3 with m+n≦3, p is an integer from 2–13. Specifically shown is 1-[3-[4-methyl-1-(3-methylbutyl)pentylamino]propyl]piperazine. These compounds are disclosed as central nervous system agents and insecticides.

SUMMARY OF THE INVENTION

This invention provides water-based compositions containing an organic or inorganic compound, particularly aqueous organic coating, ink, adhesive, fountain solution, agricultural and electronics cleaning compositions, having reduced equilibrium and dynamic surface tension by incorporation of an effective amount of an alkylated aminoalkylpiperazine compound of the following structure:

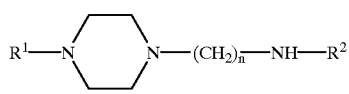

where one of $R^1$ and $R^2$ is a C5–C14 alkyl or cycloalkyl group, preferably C6–C8 alkyl, and the other is H, or both of $R^1$ and $R^2$ are C5 to C8 alkyl groups, and n is 2 or 3. It is desirable that an aqueous solution of the alkylated aminoalkylpiperazine demonstrates a dynamic surface tension of less than 45 dynes/cm at a concentration of <5 wt % in water at 23° C. and 1 bubble/second according to the maximum-bubble pressure method. The maximum-bubble-pressure method of measuring surface tension is described in *Langmuir* 1986, 2, 428–432, which is incorporated by reference.

Also provided is a method for lowering the equilibrium and dynamic surface tension of aqueous compositions by the incorporation of these alkylated aminoalkyl-piperazine compounds.

Also provided is a method for applying a coating of a water-based inorganic or organic compound-containing composition to a surface to partially or fully coat the surface with the water-based composition, the composition containing an effective amount of an alkylated aminoalkylpiperazine compound of the above structure for reducing the dynamic surface tension of the water-based composition, and the water to evaporate.

There are significant advantages associated with the use of these alkylated aminoalkylpiperazines in water-based organic coatings, inks, adhesives, fountain solutions, agricultural compositions and electronic cleaning compositions and these advantages include:

- an ability to formulate water-borne coatings, inks, and agricultural compositions which may be applied to a variety of substrates with excellent wetting of substrate surfaces including contaminated and low energy surfaces;
- an ability to provide a reduction in coating or printing defects such as orange peel and flow/leveling deficiencies;
- an ability to produce water-borne coatings and inks which have low volatile organic content, thus making these surfactants environmentally favorable;
- an ability to formulate coating and ink compositions capable of high speed application; and
- an ability to formulate compositions which retain excellent dynamic surface tension properties under strongly basic, high temperature environments.
- an ability to formulate low surface tension aqueous electronics cleaning and processing solutions, including photoresist developer solutions, for
- the semiconductor manufacturing industry with good wetting and extremely low foam.

Because of their excellent surfactant properties and the ability to control foam, these materials are likely to find use in many applications in which reduction in dynamic and equilibrium surface tension and low foam are important. Applications in which low foam is important include various wet-processing textile operations, such as dyeing of fibers, fiber souring, and kier boiling, where low-foaming properties would be particularly advantageous; they may also have applicability in soaps, water-based perfumes, shampoos, and various detergents where their marked ability to lower surface tension while simultaneously producing substantially no foam would be highly desirable.

In addition, the demands of the semiconductor fabrication industry have led to the requirement for high performance surfactants and wetting agents for photoresist developer formulations. As line features shrink to smaller sizes and photoresist substrate materials become more aliphatic in nature (i.e., lower surface energy), aqueous developer solutions increasingly are being formulated with surface tension reducing agents.

An additional requirement for these developers, accentuated by the move toward larger wafer sized, is that they exhibit low foam. This is particularly important when the so-called spray puddle techniques are used in applying the developer solution, wherein the developer is sprayed over increasingly larger areas. Even in cases where puddle or immersion techniques are used, microbubble entrainment during spreading of the solution over the photoresist surface can lead to defects. The materials according to the present invention give efficient reduction of surface tension of aqueous developer solutions and exceedingly low foam, even under extreme conditions. Other applications in the electronics industry using aqueous processing media would also benefit from good dynamic wetting and low foam.

DETAILED DESCRIPTION OF THE INVENTION

This invention relates to the use of compounds of the formula

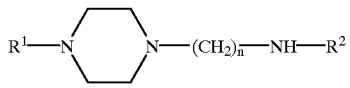

where one of $R^1$ and $R^2$ is a C5–C14 alkyl or cycloalkyl group and the other is H, or both of $R^1$ and $R^2$ are C5 to C8 alkyl groups, and n is 2 or 3, for the reduction of equilibrium and dynamic surface tension in water-based compositions containing an organic compound, particularly coating, ink, adhesive, agricultural and electronics processing compositions containing organic compounds such as polymeric resins, organic bases, herbicides, fungicides, insecticides or plant growth modifying agents. It is desirable that an aqueous solution of the alkylated aminoalkylpiperazine demonstrates a dynamic surface tension of less than 45 dynes/cm at a concentration of <5 wt % in water at 23° C. and 1 bubble/second according to the maximum-bubble-pressure method. The maximum-bubble-pressure method of measuring surface tension is described in *Langmuir* 1986, 2, 428–432, which is incorporated by reference.

In one aspect of the invention the alkylated aminoalkylpiperazines of the above formula display excellent ability to reduce equilibrium and dynamic surface tension while producing substantially no foam.

These materials can be prepared by reductive alkylation of the parent aminoalkylpiperazines with aldehydes and ketones using well-established procedures. The essential aspects of the preparation are the reaction of an aldehyde or ketone with the aminoalkylpiperazine to make an imine or eneamine intermediate which then reacts with hydrogen in the presence of a suitable hydrogenation catalyst to form the corresponding saturated derivative:

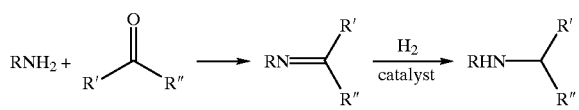

The imine or eneamine derivative may be preformed or may be prepared in situ.

The reductive alkylation procedure is the method of choice for the production of these materials, but the products may also be prepared by reaction of an aminoalkyl piperazine with an alkyl halide. This reaction is illustrated for the reaction of aminoethylpiperazine with an alkyl chloride:

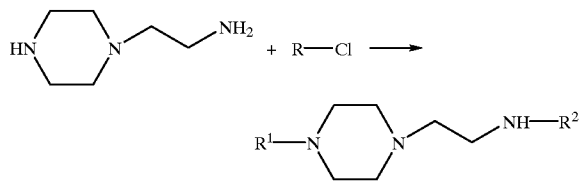

where in the product, at least one of $R^1$ and $R^2$ is R, and the other is either R or H.

Aminoalkylpiperazine starting materials which are suitable for use in the reductive alkylation reaction include compounds of the form

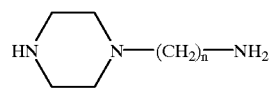

where n is 2 or 3. Specific examples include aminoethyl piperazine and aminopropyl piperazine.

Alkyl groups which are suitable for use in this invention should have sufficient carbon number to confer surface activity (i.e. an ability to reduce the surface tension of water) to the material but not enough carbon to decrease the solubility to the extent that the ability of the material to reduce surface tension is insufficient for a particular application. In general, an increase in the carbon number increases the efficiency of the surfactant (i.e. less surfactant is required to obtain a given decrease in surface tension) but decreases its ability to reduce surface tension at high surface creation rates. The latter effect is a result of the fact that increased carbon number decreases the water solubility or critical micelle concentration (CMC) of the material, and consequently, diminishes the diffusive flux of surfactant to newly-created surface. Generally, in the practice of this invention, it is desirable to use alkylated aminoalkylpiperazines with a solubility limit or CMC from 0.001 to about 20 g/100 mL of the total aqueous formulation, preferably from 0.01 to 10 g/l 100 mL, and most preferably from 0.05 to 5 g/100 mL.

Monoalkylated derivatives should be substituted with alkyl groups containing five to 14 carbon atoms, preferably six to eight carbon atoms. Alkyl groups are most-preferably derived from reductive alkylation reactions of methyl isobutyl ketone and methyl isoamyl ketone because these products would be the most economical, but alkyl groups derived from C5 to C14 aldehydes or ketones are suitable. Specific examples of suitable aldehydes and ketones include 2-pentanone, 3-pentanone, pivaldehyde, methyl isopropyl ketone, methyl isobutyl ketone, methyl isoamyl ketone, 2-hexanone, 3-hexanone, methyl tert-butyl ketone, ethyl isopropyl ketone, 2-methylhexanal, 2-heptanone, 3-heptanone, 4-heptanone, 2-octanone, 3-octanone, 4-octanone, 2-ethylhexanal, cyclopentanone, cyclohexanone, cycloheptanone, cyclooctanone, cyclodecanone, cyclododecanone, 2-dodecanonoe, 1-dodecanal, 2-tetradecanone, 8-tetradecanone, and so on. The alkyl groups may be linear or branched, and the point of attachment to nitrogen may be on either an internal or terminal carbon. The specific carbonyl compound chosen will depend on the surfactant properties required for a particular application. The alkyl groups for the monoalkylated derivatives may be attached to either the nitrogen present on the alkyl chain, or to the ring nitrogen. The use of mixtures of ring- and chain-alkylated aminoalkyl piperazines is preferred since then the synthesis and purification of the materials is simplified.

For dialkylated aminoalkyl piperazines, the alkyl groups may be the same or different, but should again contain sufficient carbon to confer surface activity, but not so much carbon that the solubility of the surfactant decreases to the extent that the ability of the surfactant to reduce the surface tension of water is insufficient for a particular application. In general, dialkylated aminoalkyl piperazines possessing alkyl groups with, in aggregate, a total of about 10 to 16 alkyl carbons are preferred. The alkyl substituents may be linear or branched, and the point of attachment to the nitrogen may be on either an internal or terminal carbon. The most preferred derivatives are those in which the alkyl groups are the same, because manufacture of these materials will be the most straightforward. Specific examples of suitable $R_1$ and $R_2$ include n-pentyl, 2-pentyl, 3-pentyl, isopentyl, n-hexyl, 2-hexyl, 3-hexyl, cyclohexyl , 2-(4-methylpentyl), 2-(5-methylhexyl), n-octyl, 2-octyl, 3-octyl, 2-dodecyl, cyclododecyl, and so on.

An amount of the aminoalkylpiperazine compound that is effective to reduce the equilibrium and/or dynamic surface tension of the water-based, organic compound-containing composition is added. Such effective amount may range from 0.001 to 20 g/100 mL, preferably 0.01 to 10 g/100 mL, and most preferably 0.05 to 5 g/100 mL of the aqueous composition. Naturally, the most effective amount will depend on the particular application and the solubility and or critical micelle concentration of the alkylated aminoalkyl piperazine.

The alkylated aminoalkylpiperazines are suitable for use in an aqueous composition comprising in water an inorganic compound which is a mineral ore or a pigment or an organic compound which is a pigment, a polymerizable monomer, such as addition, condensation and vinyl monomers, an oligomeric resin, a polymeric resin, a detergent, a caustic cleaning agent, a dissolution agent such as trimethylammonium hydroxide (TMAH), a herbicide, especially a herbicide for chlorophyll-containing plants, a fungicide, an insecticide, or a plant growth modifying agent.

In the following water-based organic coating, ink, adhesive, fountain solution, agricultural and photoresist developer compositions containing an alkylated aminoalkylpiperazine according to the invention, the other listed components of such compositions are those materials well known to the workers in the relevant art.

A typical water-based protective or decorative organic coating composition to which the alkylated aminoalkylpiperazine surfactants of the invention may be added would comprise in an aqueous medium 30 to 80 wt % of a coating composition of the following components:

| Typical Water-Based Organic Coating Composition | |
|---|---|
| 0 to 50 wt % | Pigment Dispersant/Grind Resin |
| 0 to 80 wt % | Coloring Pigments/Extender Pigments/Anti-Corrosive Pigments/Other Pigment Types |
| 5 to 99.9 wt % | Water-Borne/Water-Dispersible/Water-Soluble Resins |
| 0 to 30 wt % | Slip Additives/Antimicrobials/Processing Aids/Defoamers |
| 0 to 50 wt % | Coalescing or Other Solvents |
| 0.01 to 10 wt % | Surfactant/Wetting Agent/Flow and Leveling Agents |
| 0.01 to 20 wt % | Alkylated Aminoalkylpiperazine |

A typical water-based ink composition to which the alkylated aminoalkylpiperazine surfactants of the invention may be added would comprise in an aqueous medium 20 to 60 wt % of an ink composition of the following components:

| Typical Water-Based Ink Composition | |
|---|---|
| 1 to 50 wt % | Pigment |
| 0 to 50 wt % | Pigment Dispersant/Grind Resin |
| 0 to 50 wt % | Clay base in appropriate resin solution vehicle |
| 5 to 99.9 wt % | Water-Borne/Water-Dispersible/Water-Soluble Resins |
| 0 to 30 wt % | Coalescing Solvents |
| 0.01 to 10 wt % | Surfactant/Wetting Agent |
| 0.01 to 10 wt % | Processing Aids/Defoamers/Solubilizing Agents |
| 0.01 to 20 wt % | Alkylated Aminoalkylpiperazine |

A typical water-based agricultural composition to which the alkylated aminoalkylpiperazine surfactants of the invention may be added would comprise in an aqueous medium 0.01 to 80 wt % of an agricultural composition of the following components:

| Typical Water-Based Agricultural Composition | |
|---|---|
| 0.1 to 50 wt % | Pesticide, Insecticide, Herbicide or Plant Growth Modifying Agent |
| 0.01 to 10 wt % | Surfactant |
| 0 to 5 wt % | Dyes |
| 0 to 20 wt % | Thickeners/Stabilizers/Co-surfactants/Gel Inhibitors/Defoamers |
| 0 to 25 wt % | Antifreeze |
| 0.01 to 50 wt % | Alkylated Aminoalkyipiperazine |

A typical water-based fountain solution composition to which the alkylated aminoalkylpiperazine surfactants of the invention may be added would comprise in an aqueous medium 30 to 70 wt % of a fountain solution composition containing the following components:

| Typical Water-Based Fountain Solution | |
|---|---|
| 0.05 to 10 wt % | Film formable, water soluble macromolecule |
| 1 to 25 wt % | Alcohol, glycol, or polyol with 2–12 carbon atoms, water soluble or can be made to be water soluble |
| 0.01 to 20 wt % | Water soluble organic acid, inorganic acid, or a salt thereof |
| 0.01 to 5 wt % | Alkylated Aminoalkylpiperazine |

A typical water-based adhesive composition to which the dialkylmalate surfactants of the invention may be added would comprise in an aqueous medium 30 to 65 wt % of an adhesive composition containing the following components:

| Typical Water-Based Adhesive | |
|---|---|
| 50 to 95 wt % | Polymeric Resin (SBR, VAE, Acrylic) |
| 0 to 50 wt % | Tackifier |
| 0 to 0.5 wt % | Defoamer |
| 0.5 to 2 wt % | Alkylated Aminoalkylpiperazine |

A typical water-based photoresist developer, or electronic cleaning, composition to which the dialkylmalate surfactants of the invention may be added would comprise an aqueous medium containing the following components:

| Typical Water-Based Photoresist Developer Composition | |
|---|---|
| 0.5 to 3 wt % | Trimethylammonium Hydroxide |
| 0 to 4 wt % | Phenolic Resin |
| 10 to 1000 wt % | Alkylated Aminoalkylpiperazine |

EXAMPLE 1

This example illustrates the procedure for the preparation of the reductive alkylation product of 1-(2-aminoethyl) piperazine (AEP) and methyl isoamyl ketone (MIAK).

AEP (1.0 mole), MIAK (1.1 mole) and 10% Pd/C (4 wt % of total charge) were charged to a one liter stainless steel autoclave. The reactor was sealed and purged with nitrogen then hydrogen. The contents of the reactor were heated to 90° C. under 7 bar (100 psig) $H_2$. The pressure was increased to 55 bar (800 psig) and maintained throughout the reaction (6 hours) by the admission of hydrogen from a 1 gallon (3.79 L) ballast on demand by a dome regulator. The reactor contents were analyzed by GC/FID and found to be 77.9 area % monoalkylated and 19.2 area % dialkylated AEP. The monoalkylated product was isolated by distillation at 142–145° C., 4.0 millibar (3 Torr). The dialkylated product was purified by distillation at 148–150° C., 0.53 millibar (0.4 Torr).

The monoalkylated derivative (AEP/MIAK1) was identified by gas chromatography/mass spectrometry (gc-ms) and $^1H$ and $^{13}C$ nuclear magnetic resonance (NMR) spectroscopy as a 5.2:1 mixture of the chain and ring alkylated materials shown below.

AEP/MIAK1

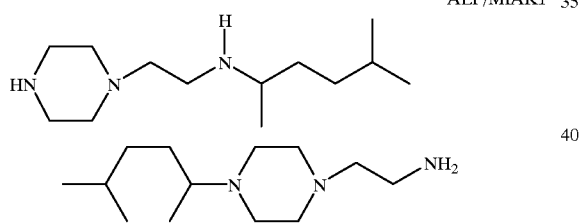

The structure of the dialkylated material, was shown to be that below using the same analytical techniques:

AEP/MIAK2

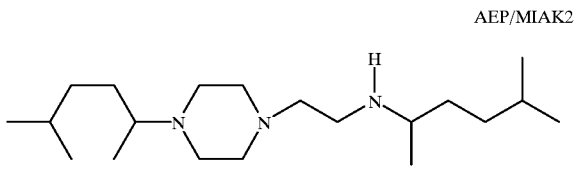

EXAMPLE 2

This example illustrates the procedure for the preparation of the reductive alkylation product of AEP and 2 equivalents of methyl isobutyl ketone (MIBK).

AEP (0.8 mole), methyl isobutyl ketone (1.6 mole) and 5% Pd/C (4 wt % of total charge) were charged to a one liter stainless steel autoclave and reacted as in Example 1 for 22 hours. The reactor contents were analyzed by GC/FID and found to be 97.9 area % dialkylated AEP. The product was purified by distillation at 152–154° C., 2.7 millibar (2 Torr).

The structure of the product was confirmed to be that shown below by gas chromatography/mass spectrometry (gc-ms) and $^1H$ and $^{13}C$ nuclear magnetic resonance (NMR) spectroscopy.

AEP/MIBK2

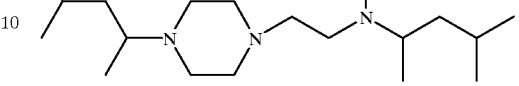

The monoalkylated derivative was prepared using a procedure similar to that used for AEP/MIBK2, except that only 1.1 equivalents of MIBK was used. The product was purified by distillation at 102–104° C., 1.0 torr. The structure of the product was confirmed by gas chromatography/mass spectrometry (gc-ms) and $^1H$ and $^{13}C$ nuclear magnetic resonance (NMR) spectroscopy. GC was used to establish that the product was comprised of a 3.3:1 mixture of chain and ring monoalkylated material.

AEP/MIBK1

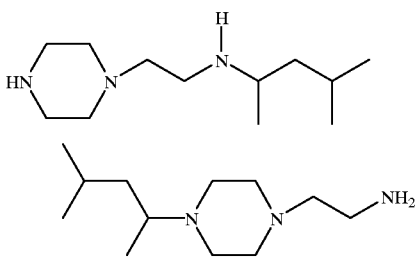

EXAMPLE 3

This example illustrates the preparation of the reductive alkylation product of AEP and cyclododecanone (CDD).

AEP (0.4 mole), cyclododecanone (0.42 mole), tetrahydrofuran (100 mL) and 10% Pd/C (4 wt % of total charge) were charged to a one liter stainless steel autoclave. The reactor was sealed and purged with nitrogen then hydrogen. The contents of the reactor were heated to 90° C. under 7 bar (100 psig) $H_2$. The pressure was increased to 55 bar (800 psig) and maintained throughout the reaction (24 hours) by the admission of hydrogen from a 1 gallon (3.79 L) ballast on demand by a dome regulator. The reactor contents were cooled to ambient temperature and the catalyst removed by filtration. The solvent and water were removed in vacuo and the crude product distilled through a 4" (10.2 cm) Vigreux column to give a forecut of 8.8 g of CDD followed by 52.1 g of AEP/CDD1 at 180–182° C. and 0.20 mbar as a colorless liquid.

The product was confirmed to be a mixture of the two compounds shown below by gas chromatography/mass spectrometry (gc-ms) and $^1H$ and $^{13}C$ nuclear magnetic resonance (NMR) spectroscopy. $^{13}C$ NMR showed that the mixture was composed of a 12:1 ratio of chain:ring alkylated material.

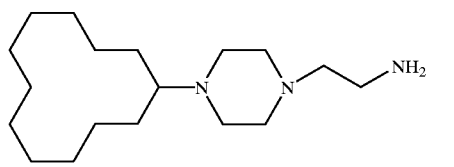

AEP/CDD1

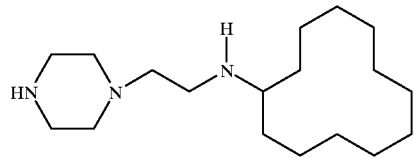

In the following Examples dynamic surface tension data were obtained for aqueous solutions of various compounds using the maximum bubble pressure method at bubble rates from 0.1 bubbles/second (b/s) to 20 b/s. These data provide information about the performance of a surfactant at conditions from near-equilibrium (0.1 b/s) through extremely high surface creation rates (20 b/s). In practical terms, high bubble rates correspond to high printing speeds in lithographic printing, high spray or roller velocities in coating applications, and rapid application rates for agricultural products.

EXAMPLE 4

Dynamic surface tension data were obtained for aqueous solutions of the reductive alkylation product of aminoethylpiperazine with one equivalent of methyl-isobutylketone (AEP/MIBK1) using the above procedure. The data are presented in Table 1.

TABLE 1

| Dynamic Surface Tension (dyne/cm) - AEP/MIBK1 | | | | | |
|---|---|---|---|---|---|
| Concentration (wt %) | 0.1 b/s | 1 b/s | 6 b/s | 15 b/s | 20 b/s |
| 1.0 | 47.0 | 48.3 | 49.7 | 50.2 | 49.8 |
| 2.0 | 42.2 | 43.0 | 43.9 | 44.7 | 44.7 |
| 5.0 | 34.1 | 37.4 | 38.1 | 38.6 | 38.6 |

These data show that AEP/MIBK1 effectively reduced the surface tension of water, and that surface tensions below 40 dyne/cm could be achieved at a use level of 5 wt %. The performance under conditions of high surface creation rate was particularly good, as illustrated by the data obtained at 20 b/s. Such a marked ability to lower the surface tension of water under a variety of conditions is certainly of utility in water borne coatings, inks, adhesives, and agricultural formulations.

EXAMPLE 5

Solutions in distilled water of the reductive alkylation product of aminoethylpiperazine with one equivalent of methyl isoamyl ketone (AEP/MIAK1) were prepared and their dynamic surface tension properties were measured using the procedure described above. The data are set forth Table. 2

TABLE 2

| Dynamic Surface Tension (dyne/cm) -AEP/MIAK1 | | | | | |
|---|---|---|---|---|---|
| Concentration (wt %) | 0.1 b/s | 1 b/s | 6 b/s | 15 b/s | 20 b/s |
| 0.1 | 48.2 | 54.6 | 57.5 | 58.2 | 58.3 |
| 0.5 | 34.8 | 37.8 | 41.6 | 44.4 | 45.2 |
| 1.0 | 31.0 | 33.0 | 35.9 | 38.2 | 38.8 |
| 2.0 | 28.2 | 28.4 | 31.3 | 33.3 | 34.1 |

These results show that for a 1.0 wt % solution of AEP/MIAK1, the surface tension at 0.1 b/s was 31.0 dyne/cm and that the surface tension increases only to 38.8 dyne/cm at 20 b/s. At a use level of 2 wt %, the surface tension measured at 0.1 b/s drops to 28.2 dyne/cm and remains under 35 dyne/cm even at 20 b/s. The ability of the surfactants of this invention to maintain this extremely low surface tension under such rapid application conditions would be of use in high speed coating and ink processes, particularly when the substrate possesses a low energy surface. The outstanding performance at these high surface creation rates will provide superior productivity by enabling high printing speeds or application rates for water-based coating, ink, and agricultural formulations.

EXAMPLE 6

Solutions in distilled water of the reductive alkylation product of aminoethylpiperazine with one equivalent of cyclododecanone (AEP/CDD1) were prepared and their dynamic surface tension properties were measured using the procedure described above. The data are set forth Table 3.

TABLE 3

| Dynamic Surface Tension (dyne/cm) - AEP/CDD1 | | | | | |
|---|---|---|---|---|---|
| Concentration (wt %) | 0.1 b/s | 1 b/s | 6 b/s | 15 b/s | 20 b/s |
| 0.05 | 39.2 | 41.1 | 46.0 | 50.5 | 50.7 |
| 0.1 | 34.9 | 36.2 | 39.7 | 42.9 | 43.5 |

The data show that AEP/CDD1 is more efficient than the surfactants of Examples 4 and 5, i.e. equivalent performance can be achieved at a lower use level. Thus, effective performance can be achieved in aqueous formulations, even at relatively low use levels.

EXAMPLE 7

Solutions in distilled water of the reductive alkylation product of aminoethylpiperazine with two equivalents of methyl isobutyl ketone (AEP/MIBK2) were prepared and their dynamic surface tension properties were measured using the procedure described above. The data are set forth Table 4.

TABLE 4

| Dynamic Surface Tension (dynes/cm) - AEP/MIBK2 | | | | | |
|---|---|---|---|---|---|
| Concentration (wt %) | 0.1 b/s | 1 b/s | 6 b/s | 15 b/s | 20 b/s |
| 0.01 | 49.6 | 53.6 | 61.7 | 68.4 | 69.9 |
| 0.05 | 38.7 | 39.7 | 42.3 | 46.0 | 46.7 |

TABLE 4-continued

Dynamic Surface Tension (dynes/cm) - AEP/MIBK2

| Concentration (wt %) | 0.1 b/s | 1 b/s | 6 b/s | 15 b/s | 20 b/s |
|---|---|---|---|---|---|
| 0.1 | 35.2 | 35.8 | 37.2 | 39.1 | 40.1 |
| 0.2 | 33.3 | 33.8 | 35.2 | 36.8 | 37.4 |

These data illustrate that the dialkylated material AEP/MIBK2 was much more efficient than the corresponding monoalkylated product AEP/MIBK1 of Example 4.

EXAMPLE 8

Solutions in distilled water of the reductive alkylation product of aminoethylpiperazine with two equivalents of methyl isoamyl ketone (AEP/MIAK2) were prepared and their dynamic surface tension properties were measured using the procedure described above. The data are set forth Table 5.

TABLE 5

Dynamic Surface Tension (dynes/cm) - AEP/MIBK2

| Concentration (wt %) | 0.1 b/s | 1 b/s | 6 b/s | 15 b/s | 20 b/s |
|---|---|---|---|---|---|
| 0.01 | 39.8 | 47.5 | 61.3 | 69.8 | 70.1 |
| 0.1 | 34.3 | 39.4 | 51.6 | 58.4 | 51.7 |
| 0.2 | 33.5 | 38.5 | 49.6 | 50.6 | 39.8 |

Again, AEP/MIAK2 exhibited a good ability to reduce dynamic surface tension in aqueous compositions.

EXAMPLE 9

The foaming properties of 0.1 wt % solutions of the alkylated aminoalkyl-piperazine surfactants of this invention were examined using a procedure based upon ASTM D 1173-53. In this test, a 0.1 wt % solution of the surfactant is added from an elevated foam pipette to a foam receiver containing the same solution. The foam height is measured at the completion of the addition ("Initial Foam Height") and the time required for the foam to dissipate at the air-liquid interface ("Time to 0 Foam") is recorded. This test provides a comparison between the foaming characteristics of various surfactant solutions. In general, in coatings, inks, and agricultural formulations, foam is undesirable because it complicates handling and can lead to coating and print defects, and to inefficient application of agricultural materials. The data are presented in Table 6.

TABLE 6

Foam Test Data

| Comoound | Initial Foam Height (cm) | Time to 0 Foam (sec) |
|---|---|---|
| AEP/MIBK1 | 2.7 | 12 |
| AEP/MIAK1 | 2.0 | 3 |
| AEP/MIBK2 | 1.7 | 2 |
| AEP/MIAK2 | 1.0 | 3 |

The data in Table 6 show that the compounds of this invention form little foam and that which forms dissipates quickly.

The ability of a surfactant in aqueous systems to reduce surface tension under both equilibrium and dynamic conditions is of great importance in the performance of water-based coatings, inks, adhesives, fountain solutions, agricultural formulations and photoresist developing and electronics cleaning compositions. Low equilibrium surface tension allows the development of excellent properties subsequent to application. Low dynamic surface tension results in enhanced wetting and spreading under the dynamic conditions of application, resulting in more efficient use of the formulations and fewer defects. In waterborne coating, ink, adhesive, fountain solution, agricultural and photoresist developing and electronics cleaning compositions, the formation of foam is generally undesirable because it complicates handling and can cause defects or result in inefficient application. The alkylated aminoalkylpiperazine surfactants of this invention display an outstanding ability to provide equilibrium and dynamic surface tension reduction in aqueous formulations while producing substantially no foam. These materials would therefore be expected to be useful in aqueous coatings, inks, adhesives, fountain solutions, agricultural formulations and photoresist developing and electronics cleaning formulations.

STATEMENT OF INDUSTRIAL APPLICATION

The invention provides compositions suitable for reducing the equilibrium and dynamic surface tension in water-based coating, ink, adhesive, fountain solution, agricultural compositions and photoresist developing and electronics cleaning compositions.

We claim:

1. In a method for applying a water-based composition to a surface to partially or fully coat the surface, the composition containing an inorganic or organic compound and an effective amount of a surfactant for reducing the dynamic surface tension of the composition, the improvement which comprises employing as the surfactant an alkylated aminoalkylpiperazine of the structure

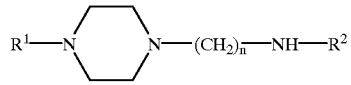

where one of $R^1$ and $R^2$ is a C5–C14 alkyl or cycloalkyl group and the other is H, or both of $R^1$ and $R^2$ are C5 to C8 alkyl groups, and n is 2 or 3.

2. The method of claim 1 in which the water-based composition contains an inorganic compound which is a mineral ore or a pigment or an organic compound which is a pigment, a polymerizable monomer, an oligomeric resin, a polymeric resin, a detergent, a caustic cleaning agent, a herbicide, a fungicide, an insecticide, or a plant growth modifying agent and an aqueous solution of the alkylated aminoalkylpiperazine demonstrates a dynamic surface tension of less than 45 dynes/cm at a concentration of $\leq 5$ wt % in water at 23° C. and 1 bubble/second according to the maximum-bubble-pressure method.

3. The method of claim 2 in which one of $R^1$ and $R^2$ is a C5–C14 alkyl or cycloalkyl group and the other is H.

4. The method of claim 2 in which one of $R^1$ and $R^2$ is a C6–C8 alkyl and the other is H.

5. The method of claim 4 in which $R^1$ and $R^2$ are C5 to C8 alkyl groups.

6. The method of claim 1 in which the alkylated aminoalkylpiperazine is the monoalkylation product of aminoethylpiperazine and methylisobutylketone, the dialkylation product of aminoethylpiperazine and methylisobutylketone, the monoalkylation product of aminoethylpiperazine and methylisoamylketone or the dialkylation product of aminoethylpiperazine and methylisoamylketone.

7. The method of claim 1 in which n is 2.

8. The method of claim 3 in which n is 2.

9. The method of claim 2 in which the measurement is made at 20 bubbles/second.

10. An aqueous composition comprising in water an inorganic compound which is a mineral ore or a pigment or an organic compound which is a pigment, a polymerizable monomer, an oligomeric resin, a polymeric resin, a detergent, a herbicide, a fungicide, an insecticide, or a plant growth modifying agent and an effective amount of an alkylated aminoalkylpiperazine for reducing the dynamic surface tension of the composition, the alkylated aminoalkylpiperazine having a structure according of the structure:

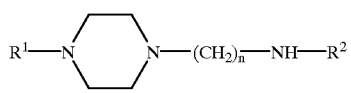

where one of $R^1$ and $R^2$ is a C5–C14 alkyl or cycloalkyl group and the other is H, or both of $R^1$ and $R^2$ are C5 to C8 alkyl groups, and n is 2 or 3.

11. The composition of claim 10 in which an aqueous solution of the alkylated aminoalkylpiperazine demonstrates a dynamic surface tension of less than 45 dynes/cm at a concentration of $\leq 5$ wt % in water at 23° C. and 1 bubble/second according to the maximum-bubble-pressure method.

12. The composition of claim 11 in which one of $R^1$ and $R^2$ is a C6–C8 alkyl and the other is H.

13. The composition of claim 11 in which $R^1$ and $R^2$ are C5 to C8 alkyl groups.

14. The composition of claim 10 in which the alkylated aminoalkylpiperazine is the monoalkylation product of aminoethylpiperazine and methylisobutylketone, the dialkylation product of aminoethylpiperazine and methylisobutylketone, the monoalkylation product of aminoethylpiperazine and methylisoamylketone or the dialkylation product of aminoethylpiperazine and methylisoamylketone.

15. The composition of claim 10 in which n is 2.

16. The composition of claim 12 in which n is 2.

17. The composition of claim 13 in which n is 2.

18. The composition of claim 11 in which the measurement is made at 20 bubbles/second.

19. The composition of claim 10 which is an aqueous organic coating composition comprising in water 30 to 80 wt % of a coating composition which comprises 0 to 50 wt % pigment dispersant, grind resin or mixtures thereof;

0 to 80 wt % coloring pigment, extender pigment, anticorrosive pigment, other pigment types or mixtures thereof;

5 to 99.9 wt % water-borne, water-dispersible or water-soluble resin or mixtures thereof;

0 to 30 wt % slip additive, antimicrobial agent, processing aid, defoamer or mixtures thereof;

0 to 50 wt % coalescing or other solvents;

0.01 to 10 wt % surfactant, wetting agent, flow and leveling agents or mixtures thereof; and 0.01 to 20 wt % alkylated aminoalkylpiperazine.

20. The composition of claim 10 which is an aqueous ink composition comprising in water 20 to 60 wt % of an ink composition which comprises 1 to 50 wt % pigment;

0 to 50 wt % pigment dispersant, grind resin or mixtures thereof;

0 to 50 wt % clay base in a resin solution vehicle;

5 to 99 wt % water-borne, water-dispersible or water-soluble resin or mixtures thereof;

0 to 30 wt % coalescing solvent;

0.01 to 10 wt % processing aid, defoamer, solubilizing agent or mixtures thereof;

0.01 to 10 wt % surfactant, wetting agent or mixtures thereof; and 0.01 to 20 wt % alkylated aminoalkylpiperazine.

21. The composition of claim 10 which is an aqueous agricultural composition comprising in water 0.01 to 80 wt % of an agricultural composition which comprises 0.1 to 50 wt % a herbicide, insecticide, plant growth modifying agent or mixtures thereof;

0.01 to 10 wt % surfactant;

0 to 5 wt % dye;

0 to 20 wt % thickener, stabilizer, co-surfactant, gel inhibitor, defoaming agent or mixtures thereof;

0 to 25 wt % antifreeze; and 0.01 to 50 wt % alkylated aminoalkylpiperazine.

22. The composition of claim 10 which is an aqueous fountain solution composition comprising in water 30 to 70 wt % of an fountain solution composition which comprises the following components 0.05 to 10 wt % film formable, water soluble macromolecule;

1 to 25 wt % alcohol, glycol, or polyol with 2–12 carbon atoms which is water soluble or can be made water soluble;

0.01 to 20 wt % water soluble organic acid, inorganic acid, or a salt thereof;

0.01 to 5 wt % alkylated aminoalkylpiperazine.

23. The composition of claim 10 which is an aqueous adhesive composition comprising in water 30 to 65 wt % of an adhesive composition which comprises the following components 50 to 99 wt % polymeric resin;

0 to 50 wt % tackifier;

0 to 0.5 wt % defoamer; and 0.5 to 2 wt % alkylated aminoalkylpiperazine.

24. The composition of claim 10 which is an aqueous electronic cleaning composition comprising in water the following components 0.5 to 3 wt % trimethylammonium hydroxide;

0 to 4 wt % phenolic resin; and 10 to 1000 ppm alkylated aminoalkylpiperazine.

* * * * *